United States Patent
Zheng

(10) Patent No.: US 11,302,380 B2
(45) Date of Patent: Apr. 12, 2022

(54) MEMORY CONTROLLER DEVICE AND PHASE CALIBRATION METHOD

(71) Applicant: REALTEK SEMICONDUCTOR CORPORATION, Hsinchu (TW)

(72) Inventor: Jie Zheng, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/120,344

(22) Filed: Dec. 14, 2020

(65) Prior Publication Data

US 2021/0343327 A1 Nov. 4, 2021

(30) Foreign Application Priority Data

Apr. 29, 2020 (CN) .......................... 202010355459.9

(51) Int. Cl.
| | |
|---|---|
| *G11C 11/4076* | (2006.01) |
| *G11C 8/18* | (2006.01) |
| *G11C 7/22* | (2006.01) |
| *G11C 11/4093* | (2006.01) |
| G11C 29/02 | (2006.01) |
| G11C 7/10 | (2006.01) |

(52) U.S. Cl.
CPC ...... *G11C 11/4076* (2013.01); *G11C 11/4093* (2013.01); *G11C 7/1084* (2013.01); *G11C 29/022* (2013.01); *G11C 29/023* (2013.01); *G11C 29/028* (2013.01); *G11C 2207/2254* (2013.01)

(58) Field of Classification Search
CPC ............ G11C 11/4076; G11C 11/4093; G11C 2207/2254; G11C 29/022; G11C 29/023; G11C 29/028; G11C 7/1084; G11C 7/1093
USPC ...................................................... 365/233.11
See application file for complete search history.

(56) References Cited

U.S. PATENT DOCUMENTS

| | | | |
|---|---|---|---|
| 7,209,397 B2 * | 4/2007 | Ware ........................ | G06F 1/105 365/194 |
| 2005/0122153 A1 * | 6/2005 | Lin ........................ | H03L 7/0814 327/291 |
| 2014/0062553 A1 * | 3/2014 | Shim ........................ | H03L 7/07 327/158 |
| 2014/0313847 A1 * | 10/2014 | Jeong ........................ | G11C 8/18 365/233.12 |

* cited by examiner

*Primary Examiner* — Ly D Pham
(74) *Attorney, Agent, or Firm* — WPAT, PC

(57) ABSTRACT

A memory controller device includes a delay line circuitry, data sampler circuits, phase detector circuits, and a control logic circuit. The delay line circuitry delays a data strobe signal to generate first to third clock signals, in which the second clock signal is for reading a data signal, and phases of the first to the third clock signals are sequentially differentiated by a predetermined value. The data sampler circuits sample the data signal according to the first to the third clock signals, in order to generate first to third signals. The phase detector circuits compare the first signal with the second signal to generate a first detection signal, and compare the third signal with the second signal to generate a second detection signal. The control logic circuit adjusts the first to the third clock signals according to the first and the second detection signals.

20 Claims, 6 Drawing Sheets

First case (D1-D2 have first logic values)

Second case (D1 has first logic value, D2 has second logic value)

Third case (D1 has second logic value, D2 has first logic value)

Fourth case (D1-D2 have second logic values)

MEMORY CONTROLLER DEVICE AND PHASE CALIBRATION METHOD

BACKGROUND OF THE INVENTION

1. Field of the Invention

The present disclosure relates to a memory controller device. More particularly, the present disclosure relates to a data reader circuit without analog phase-lock loop circuit(s) and a phase calibration method.

2. Description of Related Art

In common memories, reading/writing operations are performed according to a data strobe signal. In order to read data stored in a memory correctly, a phase of the data strobe signal is required to be aligned with a data window. However, with the variation of operating conditions (e.g., temperature or voltage), the phase of the data strobe signal may be shifted, resulting in incorrect data being read.

SUMMARY OF THE INVENTION

In some embodiments, a memory controller device includes a delay line circuitry, a plurality of data sampler circuits, a plurality of phase detector circuits, and a control logic circuit. The delay line circuitry is configured to delay a data strobe signal to generate a first clock signal, a second clock signal, and a third clock signal, in which the second clock signal is for reading a data signal, and a phase of the first clock signal, a phase of the second clock signal, and a phase of third clock signal are sequentially differentiated by a predetermined value. Each of the plurality of data sampler circuits is configured to sample the data signal according to a corresponding one of the first clock signal, the second clock signal, and the third clock signal, in order to generate a corresponding one of a first signal, a second signal, and a third signal. The plurality of phase detector circuits are configured to compare the first signal with the second signal to generate a first detection signal, and to compare the third signal with the second signal to generate a second detection signal. The control logic circuit is configured to adjust the first clock signal, the second clock signal, and the third clock signal according to the first detection signal and the second detection signal.

In some embodiments, a phase calibration method includes the following operations: delaying a data strobe signal to generate a first clock signal, a second clock signal, and a third clock signal, in which the second clock signal is for reading a data signal, and a phase of the first clock signal, a phase of the second clock signal, and a phase of third clock signal are sequentially differentiated by a predetermined value; sampling the data signal according to a corresponding one of the first clock signal, the second clock signal, and the third clock signal, in order to generate a corresponding one of a first signal, a second signal, and a third signal; comparing the first signal with the second signal to generate a first detection signal, and comparing the third signal with the second signal to generate a second detection signal; and adjusting the first clock signal, the second clock signal, and the third clock signal according to the first detection signal and the second detection signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
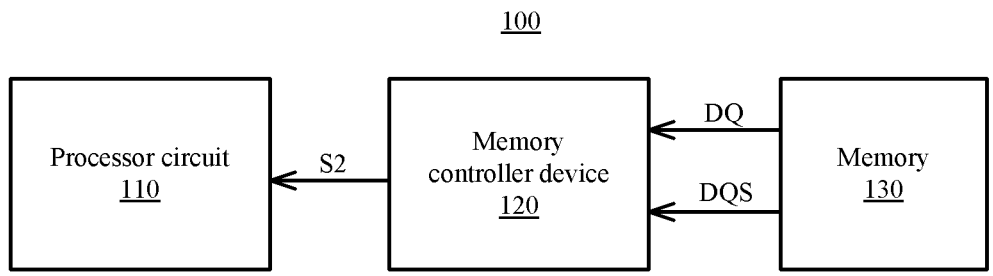
FIG. 1A is a schematic diagram of an electronic system according to some embodiments of the present disclosure.

FIG. 1A is a schematic diagram of an electronic system 100 according to some embodiments of the present disclosure. In some embodiments, the electronic system 100 may be various types of electronic devices that utilize a memory (e.g., computer, smart phone, etc). The electronic system 100 includes a processor circuit 110, a memory controller device 120, and a memory 130.

Figure 1B:
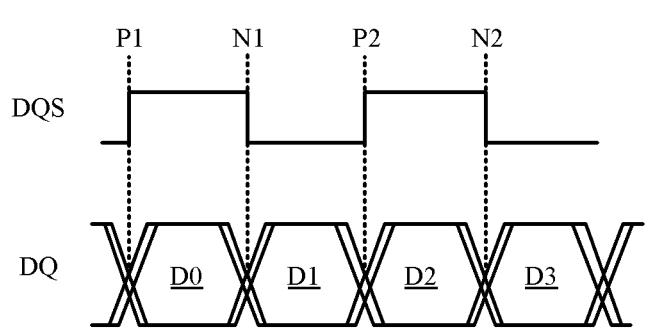
FIG. 1B is a waveform diagram of related signals in FIG. 1A according to some embodiments of the present disclosure.
Figure 1B:
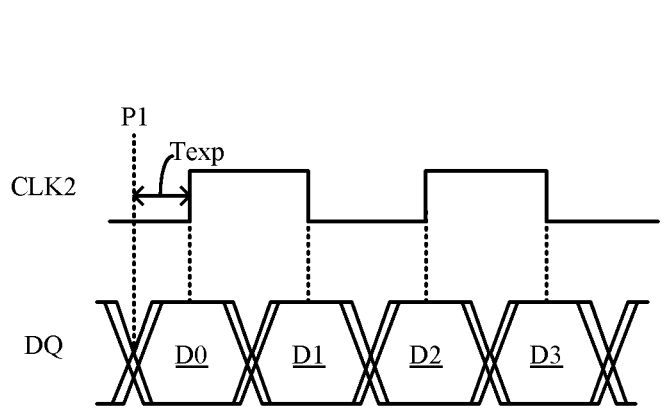

In some embodiments, the processor circuit 110 may be a circuit (which may be a central processor circuit, a microprocessor circuit, etc) having an ability of executing software. In some embodiments, the processor circuit 110 may be various types of data processing chips. The processor circuit 110 may read a data signal DQ from the memory 130 through the memory controller device 120. The memory controller device 120 may operate as an interface circuit between the processor circuit 110 and the memory 130, in which the interface circuit is configured to generate a clock signal CLK2 (as shown in FIG. 1B) according to a data strobe signal DQS from the memory 130. The memory controller device 120 may automatically adjust a phase of the clock signal CLK2, and may read data carried in the data signal DQ according to the clock signal CLK2, in order to output the data as a signal S2 to the processor circuit 110. With operation(s) of the memory controller device 120, it assures that the processor circuit 110 is able to acquire valid data carried in the data signal DQ by reading the signal S2.

In some embodiments, the memory 130 may be a double data rate (DDR) synchronous dynamic random access memory. In some embodiments, the memory 130 may a single data rate (SDR) synchronous dynamic random access memory. The types of the memory 130 are given for illustrative purposes, and the present disclosure is not limited thereto. In other embodiments, the memory 130 may be various memories that utilize the data strobe signal DQS to read/write data.

FIG. 1B is a waveform diagram of related signals in FIG. 1A according to some embodiments of the present disclosure. In this example, the memory 130 is a DDR synchronous dynamic random access memory. In read/write operations of the DDR synchronous dynamic random access memory, the data strobe signal DQS is either edge-aligned with the data signal DQ or is center-aligned with the data signal DQ.

For example, in a data writing operation, the memory 130 stores two data according to a positive edge and a negative edge of the data strobe signal DQS. For example, the memory 130 stores data D0 at a positive edge P1 of the data strobe signal DQS and stores data D1 at a negative edge N1 of the data strobe signal DQS. With this analogy, the memory 130 sequentially stores data D2 and data D3 at a positive edge P2 and a negative edge N2.

Alternatively, in a data reading operation, the memory 130 sends the data strobe signal DQS and the data signal DQ to the processor circuit 110, and the processor circuit 110 delays the data strobe signal DQS for a predetermined time Texp by using software (or firmware), in order to generate the clock signal CLK2. With the delay of the predetermined time Texp, the clock signal CLK2 and the data signal DQ are different in phase by about 90 degrees. As a result, a positive edge and a negative edge of the clock signal CLK2 are able to be aligned with centers of the data D0-D3. The memory controller device 120 may read the data signal DQ according to the positive edge or the negative edge of the clock signal CLK2, in order to output valid data in the data signal DQ to be the signal S2, and to transmit the signal S2 to the processor circuit 110. In some embodiments, the memory controller device 120 is able to automatically tune the phase of the clock signal CLK2, in order to prevent the phase of the clock signal CLK2 from being shifted due to a variation of operating condition(s) (which may include temperature, voltage, etc.). As a result, it ensures that the processor circuit 110 is able to stably read the valid data in the data signal DQ.

Figure 2:
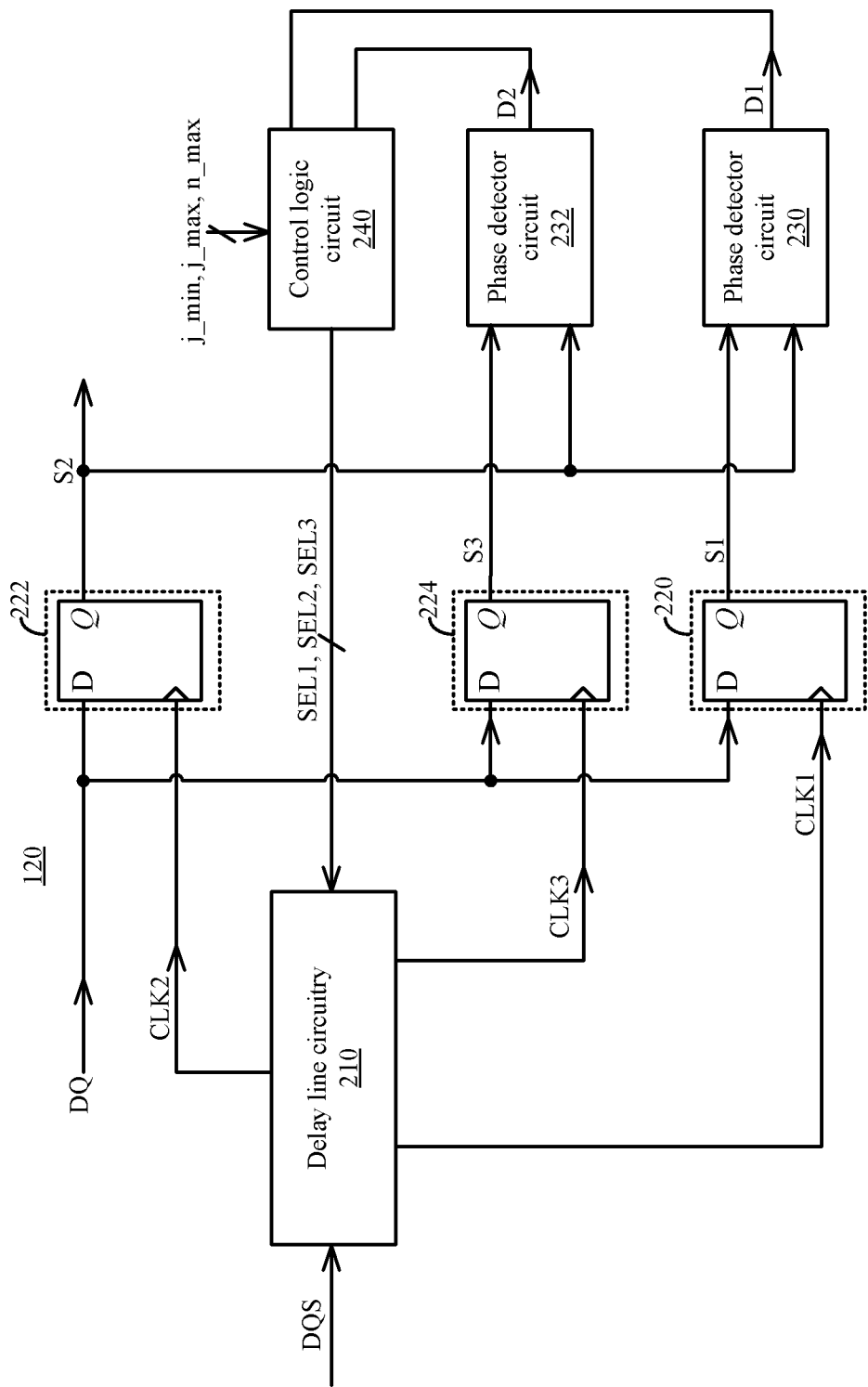
FIG. 2 is a schematic diagram of the memory controller device in FIG. 1A according to some embodiments of the present disclosure.

FIG. 2 is a schematic diagram of the memory controller device 120 in FIG. 1A according to some embodiments of the present disclosure. In some embodiments, the memory controller device 120 includes the delay line circuitry 210, data sampler circuits 220, 222, and 224, phase detector circuits 230 and 232, and a control logic circuit 240.

The delay line circuitry 210 receives the data strobe signal DQS from the memory 130, and is configured to delay the data strobe signal DQS to generate a clock signal CLK1, the clock signal CLK2, and a clock signal CLK3. A phase of the clock signal CLK1, a phase of the clock signal CLK2, and a phase of the clock signal CLK3 are sequentially differentiated by a predetermined value j. For example, if the phase of the clock signal CLK2 is defined as n, the phase of the clock signal CLK1 is defined as n−j, and the phase of the clock signal CLK3 is defined as n+j. In other words, the phase of the clock signal CLK1 lags the phase of the clock signal CLK2 by the predetermined value j and the phase of the clock signal CLK3 leads the phase of the clock signal CLK2 by the predetermined value j. In some embodiments, each of the phase n and the predetermined value j can be expressed by a data value, the control logic circuit 240 updates a selection signal SEL1, a selection signal SEL2, and a selection signal SEL3 according to these data values. The delay line circuitry 210 adjusts the clock signal CLK1, the clock signal CLK2, and the clock signal CLK3 according to the selection signal SEL1, the selection signal SEL2, and the selection signal SEL3.

Each of the data sampler circuits 220, 222, and 224 is configured to sample the data signal DQ according to a corresponding one of the clock signal CLK1, the clock signal CLK2, the clock signal CLK3, in order to generate a corresponding one of a signal S1, the signal S2, and the signal S3. In greater detail, the data sampler circuit 220 is triggered according to a positive edge (and/or a negative edge) of the clock signal CLK1, in order to output the data signal DQ to be the signal S1. The data sampler circuit 222 is triggered according to a positive edge (and/or a negative edge) of the clock signal CLK2, in order to output the data signal DQ to be the signal S2, and to provide the signal S2 to the processor circuit 110 in FIG. 1A. In other words, as mentioned in FIG. 1A, the clock signal CLK2 is for reading the data signal DQ. The data sampler circuit 224 is triggered according to a positive edge (and/or a negative edge) of the clock signal CLK3, in order to output the data signal DQ to be the signal S3.

In some embodiments, each of the data sampler circuits 220, 222, and 224 may be, but not limited to, implemented with a D-type flip flop circuit. The implementation of the data sampler circuit 220, 222, and 224 is given for illustrative purposes, and various sampler circuits able to acquire current data according to a clock signal are within the contemplated scope of the present disclosure.

The phase detector circuits 230 and 232 are configured to compare the signal S1 with the signal S2 to generate a detection signal D1, and to compare the signal S3 with the signal S2, in order to generate a detection signal D2. For example, the phase detector circuit 230 is configured to compare the signal S1 with the signal S2. If the signal S1 and the signal S2 are substantially identical, the phase detector circuit 230 outputs the detection signal D1 having a first logic value (e.g., a logic value of 1). Alternatively, if the signal S1 is different from the signal S2, the phase detector circuit 230 outputs the detection signal D1 having a second logic value (e.g., a logic value of 0). Similarly, the phase detector circuit 232 is configured to compare the signal S3 with the signal S2. If the signal S3 and the signal S2 are substantially identical, the phase detector circuit 232 outputs the detection signal D2 having the first logic value. Alternatively, if the signal S3 is different from the signal S2, the phase detector circuit 232 outputs the detection signal D2 having the second logic value.

In some embodiments, each of the phase detector circuits 230 and 232 may be, but not limited to, implemented with a XNOR gate circuit. The above implementation of the phase detector circuits 230 and 232 is given for illustrative purposes, and various detector circuits able to determine whether data are the same or different are within the contemplated scope of the present disclosure.

The control logic circuit 240 is configured to adjust the clock signal CLK1, the clock signal CLK2, and the clock signal CLK3 according to the detection signal D1 and the detection signal D2, in order to ensure that the phase of the clock signal CLK2 can be stably aligned with the center of a valid data interval in the data signal DQ. In some embodiments, the control logic circuit 240 is configured to output the selection signal SEL1, the selection signal SEL2, and the selection signal SEL3 according to the detection signal D1 and the detection D2. Descriptions regarding herein are provided in the following paragraphs with reference to FIG. 2 to FIG. 5.

In some embodiments, the control logic circuit 240 includes at least one register that is configured to store a predetermined maximum value j_max, a predetermined minimum value j_min, and a predetermined maximum value n_max. The predetermined maximum value j_max and predetermined minimum value j_min are for setting a range of the predetermined value j, and the predetermined maximum value n_max is for setting an upper limit of the phase n of the clock signal CLK2. In some embodiments, the above values can be set automatically by software executed by the processor circuit 110, or can be set according to a direct input from a user. In some embodiments, these values are for adjusting a tracking speed of the phase of the clock signal CLK2.

In some embodiments, the control logic circuit 240 may be implemented with at least one digital circuit. In some embodiments, the at least one digital circuit may be configured to execute a state machine that corresponds to operations S420 to S450 in FIG. 4A. In some embodiments, the at least one digital circuit may be, but not limited to, a digital signal processor circuit, a microcontroller circuit, or the like.

Figure 3:
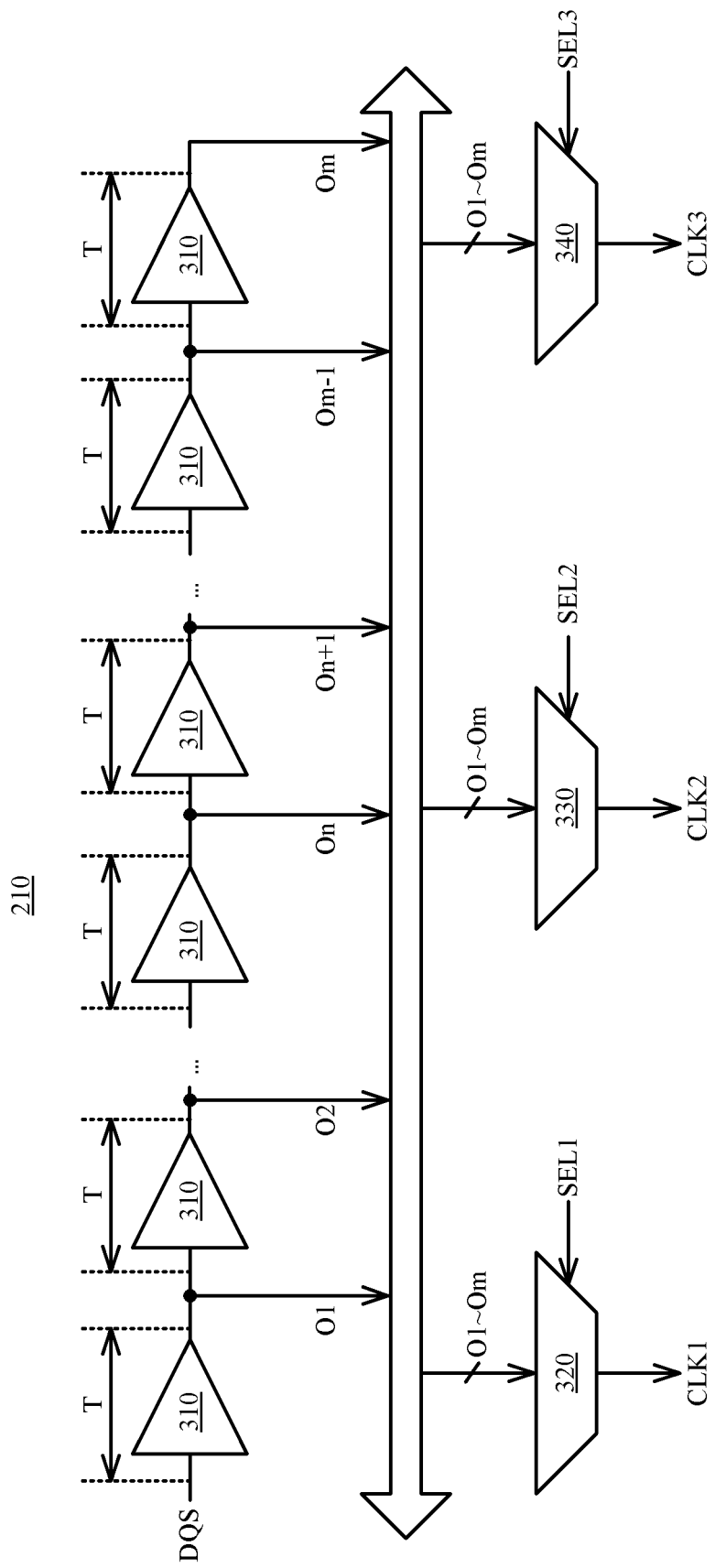
FIG. 3 is a schematic diagram of the delay line circuitry in FIG. 2 according to some embodiments of the present disclosure.

FIG. 3 is a schematic diagram of the delay line circuitry 210 in FIG. 2 according to some embodiments of the present disclosure. In some embodiments, the delay line circuitry 210 includes buffer circuits 310 and multiplexer circuits 320, 330, and 340. The buffer circuits 310 are coupled in series, in order to delay the data strobe signal DQS. Output signals O1-Om of the buffer circuits 310 are transmitted to each of the multiplexer circuits 320, 330, and 340. Each of the multiplexer circuits 320, 330, and 340 outputs a corresponding one of the output signals O1-Om to be a corresponding one of the clock signal CLK1, the clock signal CLK2, and the clock signal CLK3 according to a corresponding one of the selection signal SEL1, the selection signal SEL2, and the selection signal SEL3.

For example, the multiplexer circuit 330 outputs an output signal On in the output signals O1-Om to be the clock signal CLK2 according to the selection signal SEL2. The multiplexer circuit 320 outputs an output signal On−j (not shown) in the output signals O1-Om to be the clock signal CLK1 according to the selection signal SEL1. The multiplexer circuit 340 outputs an output signal On+j (not shown) in the output signals O1-Om to be the clock signal CLK3 according to the selection signal SEL3. In other words, if one buffer circuit 310 introduces one delay time T, the clock signal CLK2 may be considered as the data strobe signal DQS after being delayed by n buffer circuits 310. With this analogy, the clock signal CLK1 may be considered as the data strobe signal DQS after being delayed by n−j buffer circuits 310, and the clock signal CLK3 may be considered as the data strobe signal DQS after being delayed by n+j buffer circuits 310. In some embodiments, the processor circuit 110 may select n buffer circuits 310 via software (or firmware), and may delay the data strobe signal DQS via these n buffer circuits 310, in order to generate the clock signal CLK2. In other words, the predetermined time Texp in FIG. 1B is equivalent to a sum of n delay times T.

Figure 4A:
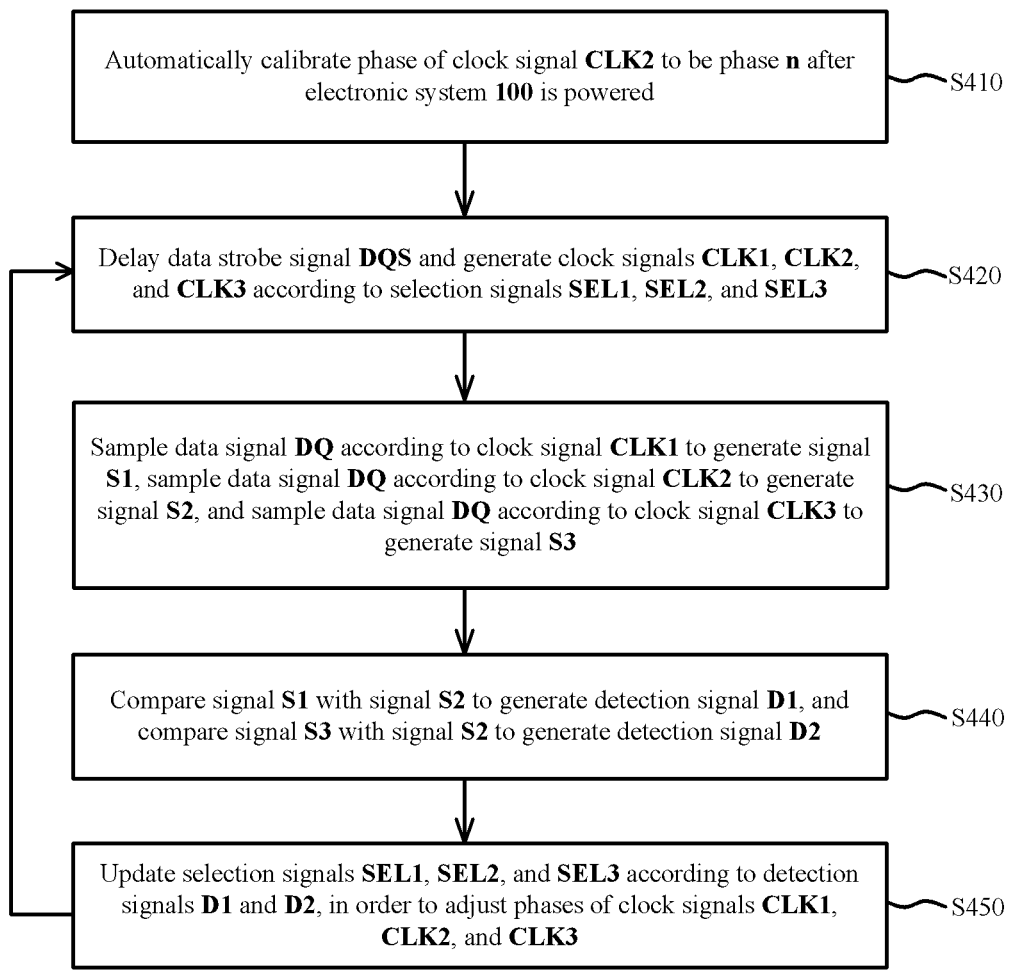
FIG. 4A is a flow chart of a phase calibration method according to some embodiments of the present disclosure.
Figure 4B:
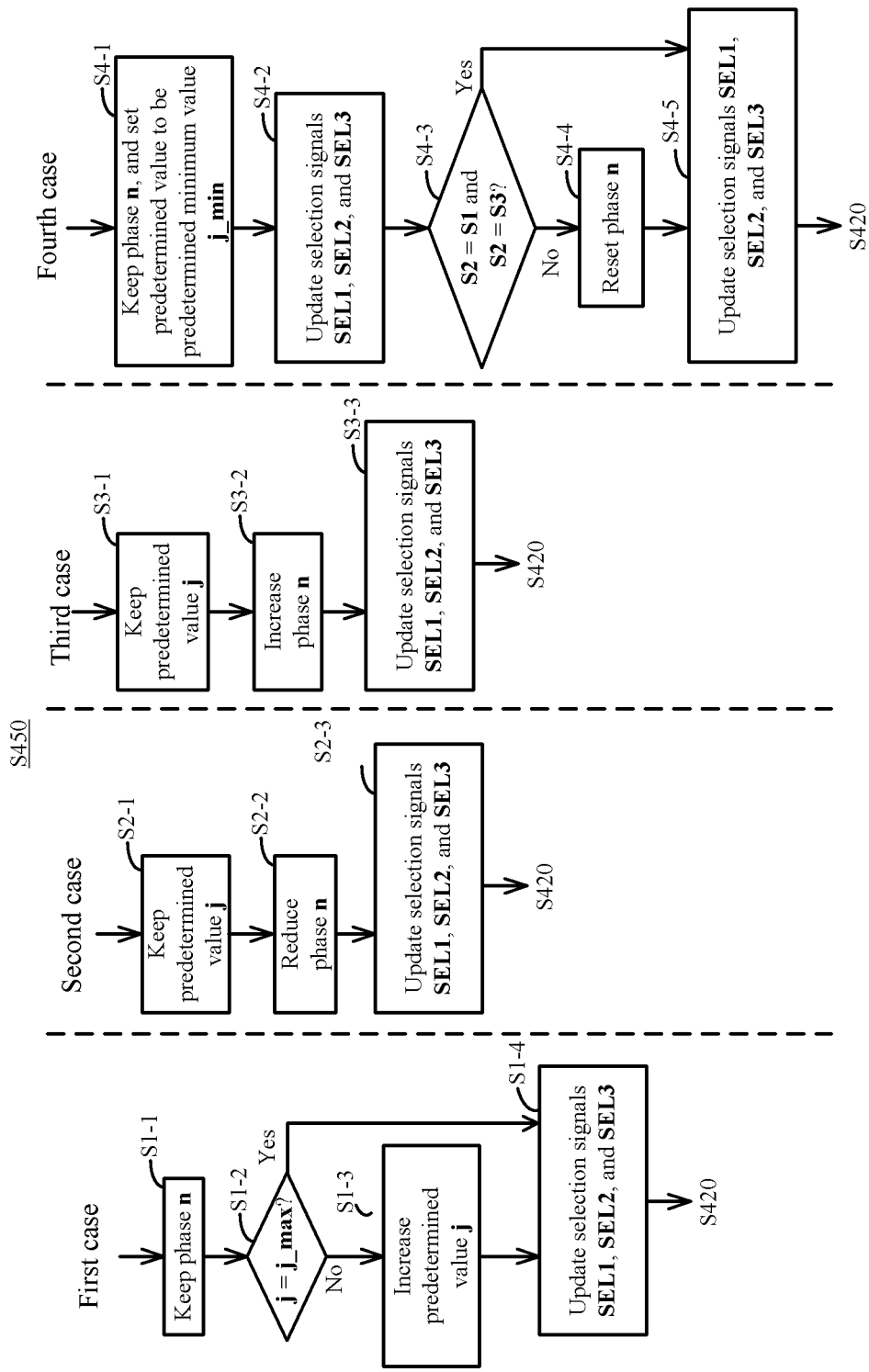
FIG. 4B is a flow chart of an operation in FIG. 4A according to some embodiments of the present disclosure.
Figure 5:
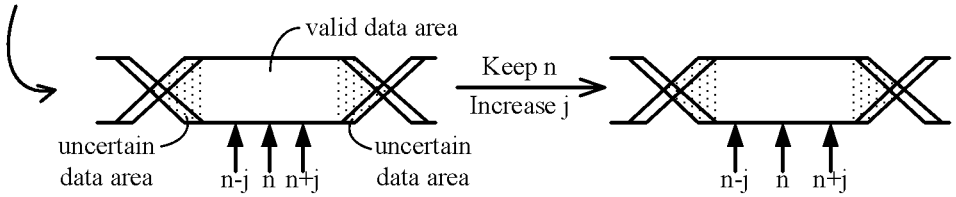
FIG. 5 is a schematic diagram showing related waveforms in FIG. 2 according to some embodiments of the present disclosure.
Figure 5:
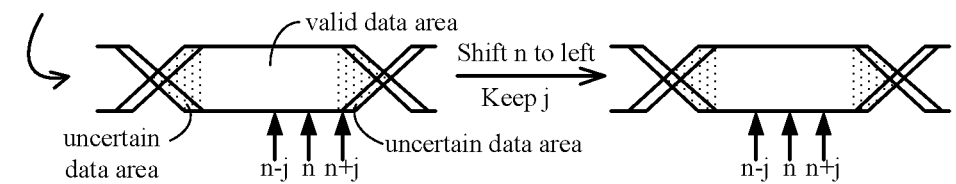
Figure 5:
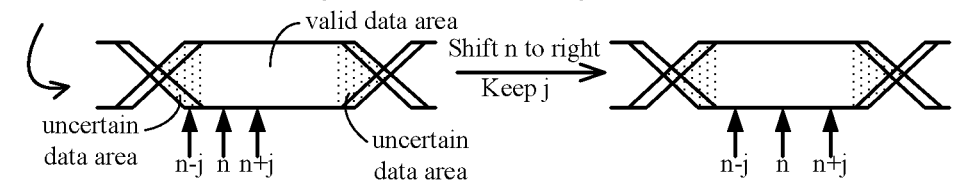
Figure 5:
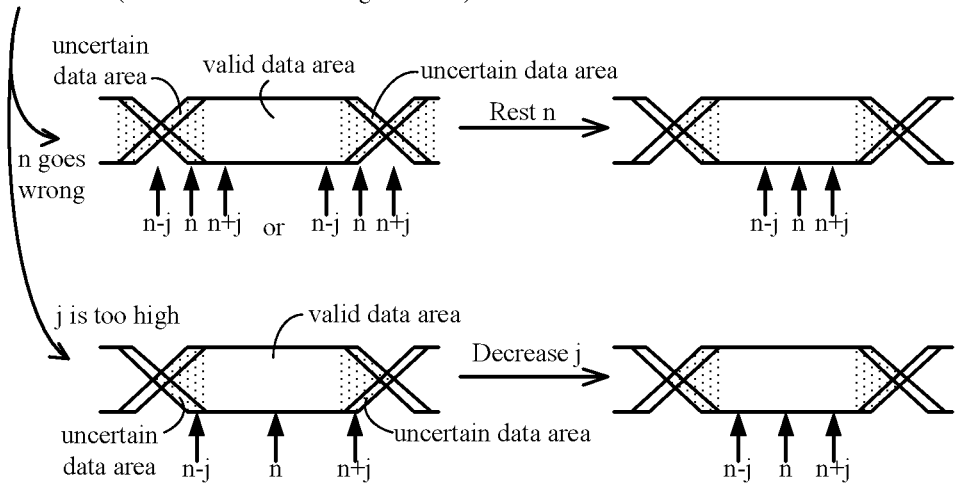

Reference is made to FIG. 2, FIG. 4A, FIG. 4B, and FIG. 5, in order to illustrate operations of the memory controller device 120. FIG. 4A is a flow chart of a phase calibration method 400 according to some embodiments of the present disclosure, FIG. 4B is a flow chart of operation S450 in FIG. 4A according to some embodiments of the present disclosure, and FIG. 5 is a schematic diagram illustrating related waveforms in FIG. 2 according to some embodiments of the present disclosure. In some embodiments, the phase calibration method 400 may be, but not limited to, performed by the control logic circuit 240 in FIG. 2.

In operation S410, after the electronic system 100 is powered, the phase of the clock signal CLK2 is automatically calibrated to be a phase n. For example, when the electronic system 100 is powered, the processor circuit 110 may execute software to send a reset command (not shown) to the delay line circuitry 210. In response to this reset command, the delay line circuitry 210 delays the data strobe signal DQS by the predetermined time Texp, in order to generate the clock signal CLK2 having the phase n, in which the phase n and the phase the data strobe signal DQS are different in phase by about 90 degrees (as shown in FIG. 1B).

In operation S420, the data strobe signal DQS is delayed and the clock signal CLK1, the clock signal CLK2 and the clock signal CLK3 are generated according to the selection signal SEL1, the selection signal SEL2, and the selection signal SEL3. In operation S430, the data signal DQ is sampled according to the clock signal CLK1 to generate the signal S1, the data signal DQ is sampled according to the clock signal CLK2 to generate the signal S2, and the data signal DQ is sampled according to the clock signal CLK3 to generate the signal S3. In operation S440, the signal S1 is compared with the signal S2 to generate the detection signal D1 and the signal S3 is compared with the signal S2 to generate the detection signal D2. Operations S420, S430, and S440 can be understood with reference to previous descriptions about FIG. 2 and FIG. 3, and thus the repetitious descriptions are not further given.

In operation S450, the selection signal SEL1, the selection signal SEL2, and the selection signal SEL3 are updated according to the detection signal D1 and the detection signal D2, in order to adjust the phase of the clock signal CLK1, the phase of the clock signal CLK2, and the phase of the clock signal CLK3. By repeatedly performing operation S420 to operation S450, the memory controller device 120 automatically adjusts the phase of the clock signal CLK2, in order to ensure that the processor circuit 110 is able to stably read valid data.

In order to understand operation S450, reference is made to FIG. 4B and FIG. 5. Operation S450 may include steps S1-1 to S1-4, steps S2-1 to S2-3, steps S3-1 to S3-3, and steps S4-1 to S4-5.

In step S1-1, the phase n is kept. In step S1-2, whether the predetermined value j is the predetermined maximum value j_max is determined. If the predetermined value j is not the predetermined maximum value j_max, step S1-3 is performed. In step S1-3, the predetermined value j is increased. If the predetermined value j is the predetermined maximum value j_max, step S1-4 is performed. In step S1-4, the selection signal SEL1, the selection signal SEL2, and the selection signal SEL3 are updated.

For example, as shown in FIG. 5, in a first case, sampling points corresponding to the phase n−j of the clock signal CLK1, the phase n of the clock signal CLK2, and the phase n+j of the clock signal CLK3 all fall within valid data area (i.e., a central area close to data window) of the data signal DQ. Under this condition, the signal S2 is substantially identical to each of the signal S1 and the signal S3, and thus both of the detection signal D1 and the detection D2 have the first logic values. In response to the detection signal D1 and the detection signal D2, the control logic circuit 240 keeps the phase n (i.e., step S1-1), and sequentially increases the predetermined value j to the predetermined maximum value j_max (i.e., step S1-2 to step S1-4), in order to increase margins of data sampling. As a result, the sampling points are able to cover the range of the valid data area as fully as possible.

With continued reference to FIG. 4B, in step S2-1, the predetermined value j is kept. In step S2-2, the phase n is reduced. In step S2-3, the selection signal SEL1, the selection signal SEL2, and the selection signal SEL3 are updated. For example, as shown in FIG. 5, in a second case, sampling points corresponding to the phase n−j of the clock signal CLK1 and the phase n of the clock signal CLK2 fall within the valid data area of, while the sampling point corresponding to the phase n+j of the clock signal CLK3 falls within a uncertain data area (shown as a dotted area, which is a area close to transiting edges) of the data signal DQ. Under this condition, the signal S2 is substantially identical to the signal S1 and is different from the signal S3, and thus the detection signal D1 has the first logic value and the detection signal D2 has the second logic value. In response to the detection signal D1 and the detection signal D2, the control logic circuit 240 keeps the predetermined value j (i.e., step S2-1) and shifts the phase n to the left (i.e., S2-2). As a result, the sampling points are calibrated to fall within the valid data area.

With continued reference to FIG. 4B, in step S3-1, the predetermined value j is kept. In step S3-2, the phase n is increased. In step S3-3, the selection signal SEL1, the selection signal SEL2, and the selection signal SEL3 are updated. For example, as shown in FIG. 5, in a third case, the sampling point corresponding to the phase n−j of the clock signal CLK1 falls within the uncertain data area of the data signal DQ, the sampling points corresponding to the phase n of the clock signal CLK2 and the phase n+j of the clock signal CLK3 fall within the valid data area. Under this condition, the signal S2 is substantially identical to the signal S3 and is different from the signal S1, and thus the detection signal D1 has the second logic value and the detection signal D2 has the first logic value. In response to the detection signal D1 and the detection signal D2, the control logic circuit 240 keeps the predetermined value j (i.e., step S3-1) and shifts the phase n to the right (i.e., step S3-2). As a result, the sampling points are calibrated to fall within the valid data area. In other words, when the signal S2 is different from one of the signal S1 and the signal S3 and is the substantially identical to another one of the signal S1 and the signal S3 (i.e., the second case or the third case), the control logic circuit 240 is able to shift the phase n of the clock signal CLK2, in order to ensure that the valid data can be sampled.

With continued reference to FIG. 4B, in step S4-1, the phase n is kept, and the predetermined n is set to be the predetermined minimum value j_min. In step S4-2, the selection signal SEL1, the selection signal SEL2, and the selection signal SEL3 are updated. In step S4-3, according to the detection signal D1 and the detection signal D2 received in a next cycle, whether the signal S2 is substantially identical to the signal S1 and the signal S3 is determined. If the signal S2 is not substantially identical to each of the signal S1 and the signal S3, step S4-4 is performed. If the signal S2 is substantially identical to each of the signal S1 and the signal S3, step S4-5 is performed. In step S4-4, the phase n is reset. In step S4-5, the selection signal SEL1, the selection signal SEL2, and the selection signal SEL3 are updated.

For example, as shown in FIG. 5, a fourth case may present in two conditions. Under a first condition, at least two sampling points (which includes the sampling point corresponding to the phase n) fall within the uncertain data area because the phase n goes wrong. Under a second condition, the sampling points corresponding to the phase n−j of the clock signal CLK1 and the phase n+j of the clock signal CLK3 fall within the uncertain data area because the predetermined value j is too high. In these two conditions, the signal S2 would be different from any of the signal S1 and the signal S, and thus both of the detection signal D1 and the detection signal D2 have the second logic values. In response to the detection signal D1 and the detections signal D2, the control logic circuit 240 keeps the phase n and sets the predetermined value j to be the predetermined minimum value j_min (i.e., step S4-1), and determines whether the signal S2 is substantially identical to the signal S1 and the signal S2 according to the detection signal D1 and the detection signal D2 received in the next cycle (i.e., step S4-2 and step S4-3).

It is understood that, if the predetermined value j has reached the predetermined minimum value j_min and the subsequent signal S2 is still different from each of the signal S1 and the signal S3, it indicates that the phase n goes wrong and cause at least two sampling points (which include the sampling point corresponding to the phase n) still falling within the uncertain data area (i.e., the first condition is occurred). Under this condition, the detection signal D1 and the detection signal D2 still have the second logic values. In response to the detection signal D1 and the detection signal D2, the control logic circuit 240 may reset the phase n (i.e., step S4-4), in order to calibrate the sampling points into the valid data area. Alternatively, if the predetermined value j has reached the predetermined minimum value j_min and the subsequent signal S2 is substantially identical to each of the signal S1 and the signal S3, it indicates that the previous predetermined value j was too high (i.e., the second condition is occurred). Under this condition, both of the detection signal D1 and the detection signal D2 have the first logic values, and thus the selection signal SEL1, the selection signal SEL2, and the selection signal SEL3 can be updated according to the current related parameters. In other words, by reducing the predetermined value j, it is sufficient to calibrate the sampling points into the valid data area.

The above description of the phase calibration method 400 includes exemplary operations, but the operations of the phase calibration method 400 are not necessarily performed in the order described above. Operations of the phase calibration method 400 can be added, replaced, changed order, and/or eliminated, or the operations of the phase calibration method 400 can be executed simultaneously or partially simultaneously as appropriate, in accordance with the spirit and scope of various embodiments of the present disclosure.

As described above, the memory controller device and the phase calibration method in some embodiments of the present disclosure are able to automatically tune the phase of the clock signal for reading the data signal without utilizing analog circuit(s) which may include a phase locked loop or the like. As a result, the circuit layout and the phase tuning mechanism can be simplified.

Moreover, in some embodiments of the present disclosure, related parameters for tracking phases can be set via software, and thus higher flexibility can be achieved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory controller device, comprising:
    a delay line circuitry configured to delay a data strobe signal to generate a first clock signal, a second clock signal, and a third clock signal, wherein the second clock signal is for reading a data signal, and a phase of the first clock signal, a phase of the second clock signal, and a phase of third clock signal are sequentially differentiated by a predetermined value;
    a plurality of data sampler circuits, wherein each of the plurality of data sampler circuits is configured to sample the data signal according to a corresponding one of the first clock signal, the second clock signal, and the third clock signal, in order to generate a corresponding one of a first signal, a second signal, and a third signal;
    a plurality of phase detector circuits configured to compare the first signal with the second signal to generate a first detection signal, and to compare the third signal with the second signal to generate a second detection signal; and
    a control logic circuit configured to adjust the first clock signal, the second clock signal, and the third clock signal according to the first detection signal and the second detection signal.

2. The memory controller device of claim 1, wherein the delay line circuitry comprises:
    a plurality of buffer circuits coupled in series and configured to delay the data strobe signal; and
    a plurality of multiplexer circuits, wherein each of the plurality of multiplexer circuits is configured to output an output signals from a corresponding one of the plurality of buffer circuits to be a corresponding one of the first clock signal, the second clock signal, and the third clock signal according to a corresponding one of a first selection signal, a second selection signal, and a third selection signal,
    wherein the control logic circuit is further configured to output the first selection signal, the second selection signal, and the third selection signal in response to the first detection signal and the second detection signal, in order to adjust the first clock signal, the second clock signal, and the third clock signal.

3. The memory controller device of claim 1, wherein if the second signal is substantially identical to each of the first signal and the third signal, the control logic circuit is configured to sequentially increase the predetermined value to a predetermined maximum value in response to the first detection signal and the second detection signal.

4. The memory controller device of claim 1, wherein if the second signal is substantially identical to each of the first signal and the third signal, the control logic circuit is configured to keep the phase of the second clock signal in response to the first detection signal and the second detection signal.

5. The memory controller device of claim 1, wherein if the second signal is substantially identical to one of the first signal and the third signal and is different from another one of the first signal and the third signal, the control logic circuit is configured to shift the phase of the second clock signal in response to the first detection signal and the second detection signal.

6. The memory controller device of claim 1, wherein if the second signal is substantially identical to one of the first signal and the third signal and is different from another one of the first signal and the third signal, the control logic circuit is configured to keep the predetermined value in response to the first detection signal and the second detection signal.

7. The memory controller device of claim 1, wherein if the second signal is different from each of the first signal and the third signal, the control logic circuit is configured to set the predetermined value to be a predetermined minimum value in response to the first detection signal and the second detection signal, and to determine whether the second signal is substantially identical to the first signal and the third signal according to the first detection signal and the second detection signal that are received in an next cycle.

8. The memory controller device of claim 7, wherein the control logic circuit determines that the second signal is different from each of the first signal and the third signal, the control logic circuit is further configured to reset the phase of the second clock signal.

9. The memory controller device of claim 1, wherein the plurality of phase detector circuits comprise:
    a first phase detector circuit configured to output the first detection signal having a first logic value when the first signal is substantially identical to the second signal, and to output the first detection signal having a second logic value when the first signal is different from the second signal; and
    a second phase detector circuit configured to output the second detection signal having the first logic value when the third signal is substantially identical to the second signal, and to output the second detection signal having the second logic value when the third signal is different from the second signal.

10. The memory controller device of claim 1, wherein each of the plurality of data sampler circuits is a D-type flip flop circuit.

11. The memory controller device of claim 1, wherein the data strobe signal is from a double data rate synchronous dynamic random access memory.

12. A phase calibration method, comprising:
    delaying a data strobe signal to generate a first clock signal, a second clock signal, and a third clock signal, wherein the second clock signal is for reading a data signal, and a phase of the first clock signal, a phase of the second clock signal, and a phase of third clock signal are sequentially differentiated by a predetermined value;
    sampling the data signal according to a corresponding one of the first clock signal, the second clock signal, and the third clock signal, in order to generate a corresponding one of a first signal, a second signal, and a third signal;
    comparing the first signal with the second signal to generate a first detection signal, and comparing the third signal with the second signal to generate a second detection signal; and
    adjusting the first clock signal, the second clock signal, and the third clock signal according to the first detection signal and the second detection signal.

13. The phase calibration method of claim 12, wherein generating the first clock signal, the second clock signal, and the third clock signal comprises:
    delaying, by a plurality of buffer circuits, the data strobe signal, wherein the plurality of buffer circuits are coupled in series; and
    outputting an output signals from a corresponding one of the plurality of buffer circuits to be a corresponding one of the first clock signal, the second clock signal, and the third clock signal according to a corresponding one of a first selection signal, a second selection signal, and a third selection signal,
    wherein the first selection signal, the second selection signal, and the third selection signal are generated in response to the first detection signal and the second detection signal.

14. The phase calibration method of claim 12, wherein adjusting the first clock signal, the second clock signal, and the third clock signal comprises:
    if the second signal is substantially identical to each of the first signal and the third signal, sequentially increasing the predetermined value to a predetermined maximum value in response to the first detection signal and the second detection signal.

15. The phase calibration method of claim 12, wherein adjusting the first clock signal, the second clock signal, and the third clock signal comprises:
    if the second signal is substantially identical to each of the first signal and the third signal, keeping the phase of the second clock signal in response to the first detection signal and the second detection signal.

16. The phase calibration method of claim 12, wherein adjusting the first clock signal, the second clock signal, and the third clock signal comprises:
    if the second signal is substantially identical to one of the first signal and the third signal and is different from another one of the first signal and the third signal, shifting the phase of the second clock signal in response to the first detection signal and the second detection signal.

17. The phase calibration method of claim 12, wherein adjusting the first clock signal, the second clock signal, and the third clock signal comprises:
    if the second signal is substantially identical to one of the first signal and the third signal and is different from another one of the first signal and the third signal, keeping the predetermined value in response to the first detection signal and the second detection signal.

18. The phase calibration method of claim 12, wherein adjusting the first clock signal, the second clock signal, and the third clock signal comprises:
    if the second signal is different from each of the first signal and the third signal, setting the predetermined value to be a predetermined minimum value in response to the first detection signal and the second detection signal; and
    determining whether the second signal is substantially identical to the first signal and the third signal according to the first detection signal and the second detection signal that are received in an next cycle.

19. The phase calibration method of claim 18, further comprising:
    if the second signal is determined to be different from each of the first signal and the third signal, resetting the phase of the second clock signal.

20. The phase calibration method of claim 12, wherein comparing the first signal with the second signal to generate the first detection signal, and comparing the third signal with the second signal to generate the second detection signal comprising:
    outputting the first detection signal having a first logic value when the first signal is substantially identical to the second signal, and outputting the first detection signal having a second logic value when the first signal is different from the second signal; and
    outputting the second detection signal having the first logic value when the third signal is substantially identical to the second signal, and outputting the second detection signal having the second logic value when the third signal is different from the second signal.

* * * * *